US007078152B2

(12) United States Patent
Rondon et al.

(10) Patent No.: US 7,078,152 B2
(45) Date of Patent: Jul. 18, 2006

(54) LITHOGRAPHIC PRINTING WITH PRINTING MEMBERS HAVING PLASMA POLYMER LAYERS

(75) Inventors: Sonia Rondon, Andover, MA (US); Susan J. Lanphear, Henniker, NH (US)

(73) Assignee: Presstek, Inc., Hudson, NH (US)

( * ) Notice: Subject to any disclaimer, the term of this patent is extended or adjusted under 35 U.S.C. 154(b) by 0 days.

(21) Appl. No.: 10/839,646

(22) Filed: May 5, 2004

(65) Prior Publication Data

US 2005/0250048 A1 Nov. 10, 2005

(51) Int. Cl.
*G03F 7/004* (2006.01)
*G03F 7/36* (2006.01)

(52) U.S. Cl. .................. 430/271.1; 430/302; 430/945; 101/462; 101/467

(58) Field of Classification Search ................ 430/302, 430/271.1, 945; 101/462, 467
See application file for complete search history.

(56) References Cited

U.S. PATENT DOCUMENTS

| | | | | |
|---|---|---|---|---|
| 4,577,932 A | | 3/1986 | Gelbart | 350/358 |
| 4,743,327 A | * | 5/1988 | DeHaan et al. | 156/272.6 |
| 5,102,708 A | * | 4/1992 | Matsubara et al. | 428/64.5 |
| 5,310,869 A | | 5/1994 | Lewis et al. | 430/272.1 |
| 5,339,737 A | | 8/1994 | Lewis et al. | 101/454 |
| 5,385,092 A | | 1/1995 | Lewis et al. | 101/467 |
| 5,517,359 A | | 5/1996 | Gelbart | 359/623 |
| RE35,512 E | | 5/1997 | Nowak et al. | 101/454 |
| 5,802,034 A | | 9/1998 | Gelbart | 369/102 |
| 5,836,249 A | * | 11/1998 | Chatterjee et al. | 101/467 |
| 5,861,992 A | | 1/1999 | Gelbart | 359/619 |
| 5,972,435 A | * | 10/1999 | Takai et al. | 427/488 |
| 6,105,501 A | * | 8/2000 | Phillips et al. | 101/457 |
| 6,238,843 B1 | | 5/2001 | Ray et al. | 430/302 |
| 2002/0146636 A1 | * | 10/2002 | Ellis | 430/200 |

FOREIGN PATENT DOCUMENTS

| | | |
|---|---|---|
| WO | 2000/15435 | 3/2000 |

OTHER PUBLICATIONS

International Search Report for International Application No. PCT/US05/015343 dated Sep. 14, 2005 (3 pages).
Written Opinion for International Application No. PCT/US05/015343 dated Sep. 14, 2005 (5 pages).

* cited by examiner

*Primary Examiner*—John S. Chu
(74) *Attorney, Agent, or Firm*—Goodwin Procter LLP

(57) ABSTRACT

A plasma polymer layer facilitates selective removal of the imaging layer of a lithographic printing member, which allows for imaging with low-power lasers. The printing member can be used on press immediately after being imaged without the need for a post-imaging processing step.

59 Claims, 5 Drawing Sheets

LITHOGRAPHIC PRINTING WITH PRINTING MEMBERS HAVING PLASMA POLYMER LAYERS

BACKGROUND OF THE INVENTION

In offset lithography, a printable image is present on a printing member as a pattern of ink-accepting (oleophilic) and ink-rejecting (oleophobic) surface areas. Once applied to these areas, ink can be efficiently transferred to a recording medium in the imagewise pattern with substantial fidelity. In a wet lithographic system, the non-image areas are hydrophilic, and the necessary ink-repellency is provided by an initial application of a dampening fluid to the plate prior to inking. The dampening fluid prevents ink from adhering to the non-image areas, but does not affect the oleophilic character of the image areas. Ink applied uniformly to the wetted printing member is transferred to the recording medium only in the imagewise pattern. Typically, the printing member first makes contact with a compliant intermediate surface called a blanket cylinder which, in turn, applies the image to the paper or other recording medium. In typical sheet-fed press systems, the recording medium is pinned to an impression cylinder, which brings it into contact with the blanket cylinder.

To circumvent the cumbersome photographic development, plate-mounting, and plate-registration operations that typify traditional printing technologies, practitioners have developed electronic alternatives that store the imagewise pattern in digital form and impress the pattern directly onto the plate. Plate-imaging devices amenable to computer control include various forms of lasers.

Current laser-based lithographic systems generally rely on removal of an energy-absorbing layer from the lithographic plate to create an image. Exposure to laser radiation may, for example, cause ablation—i.e., catastrophic overheating—of the ablated layer in order to facilitate its removal. Accordingly, the laser pulse must transfer substantial energy to the absorbing layer. This means that even low-power lasers must be capable of very rapid response times, and imaging speeds (i.e., the laser pulse rate) must not be so fast as to preclude the requisite energy delivery by each imaging pulse. In addition, existing printing members often require a post-imaging processing step to remove debris generated during the imaging process.

BRIEF SUMMARY OF THE INVENTION

The present invention utilizes a plasma polymer layer to facilitate selective removal of the imaging layer of a lithographic plate, which allows for imaging with low-power lasers. In addition, the printing member can be used on-press immediately after being imaged without the need for a post-imaging processing step. In a first aspect, the invention involves a lithographic printing member that includes an imaging layer that absorbs imaging radiation, a plasma polymer layer that includes a plasma-polymerized hydrocarbon, and a substrate beneath the imaging and plasma polymer layers. The imaging layer and at least one of the plasma polymer layer and the substrate have opposite affinities for ink and a liquid to which ink will not adhere.

The imaging layer may be hydrophilic. It may include a ceramic, such as one or more metal carbides (e.g., TiC, ZrC, HfC, VC, NbC, TaC, $B_4C$, and SiC), metal nitrides (e.g., TiN, ZrN, HfN, VN, NbN, TaN, BN, $Si_3N_4$, $Cr_3C$, $Mo_2C$, and WC), metal oxides (e.g., TiO, $Ti_2O_3$, TiO2, BeO, MgO, and $ZrO_2$), carbonitrides, oxynitrides, oxycarbides, or combinations thereof. The plasma polymer layer may be oleophilic. In some embodiments, the plasma polymer layer has a thickness of about 1 nm to about 20 nm. The hydrocarbon gas used to form the plasma polymer layer may include methane, ethane, propane, ethylene, or acetylene. The substrate may be hydrophilic or oleophilic. Suitable materials for the substrate include polymers (e.g., polyesters, such as polyethylene terephthalate and polyethylene naphthalate, polycarbonates, polyurethane, acrylic polymers, polyamide polymers, phenolic polymers, polysulfones, polystyrene, and cellulose acetate) and metals (e.g., aluminum, chromium, steel, and alloys thereof). At least one surface of a metal substrate may be anodized. A transition layer may be disposed over the substrate. The transition layer may include a polymer, such as an acrylate polymer.

In some embodiments, the plasma polymer layer is disposed over the imaging layer. In other embodiments, the imaging layer is disposed over the plasma polymer layer. These embodiments may include a protective layer disposed over the imaging layer. The protective layer may be hydrophilic. Polyvinyl alcohol is a suitable material for a protective layer.

In another aspect, the invention involves involves a method of imaging the lithographic printing member described above. The printing member is exposed to imaging radiation in an imagewise pattern, which causes at least a portion of the imaging layer exposed to the radiation to ablate. At least the portions of the imaging layer that received radiation are removed to create an imagewise lithographic pattern on the printing member.

It should be stressed that, as used herein, the term "plate" or "member" refers to any type of printing member or surface capable of recording an image defined by regions exhibiting differential affinities for ink and/or fountain solution. Suitable configurations include the traditional planar or curved lithographic plates that are mounted on the plate cylinder of a printing press, but can also include seamless cylinders (e.g., the roll surface of a plate cylinder), an endless belt, or other arrangement.

Furthermore, the term "hydrophilic" is used in the printing sense to connote a surface affinity for a fluid which prevents ink from adhering thereto. Such fluids include water for conventional ink systems, aqueous and non-aqueous dampening liquids, and the non-ink phase of single-fluid ink systems. Thus, a hydrophilic surface in accordance herewith exhibits preferential affinity for any of these materials relative to oil-based materials.

BRIEF DESCRIPTION OF THE DRAWINGS

The foregoing discussion will be understood more readily from the following detailed description of the invention when taken in conjunction with the accompanying drawings, in which.

Figure 1:
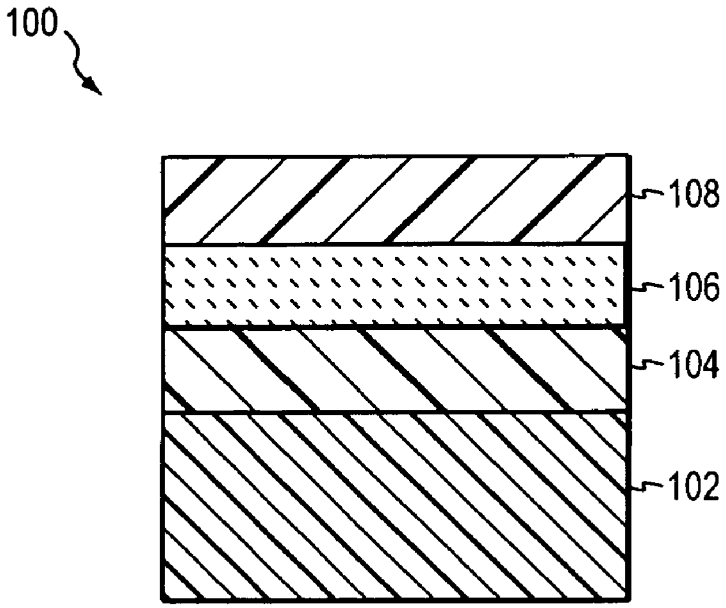
FIG. 1 is an enlarged sectional view of an embodiment of a negative-working printing member according to the invention that contains substrate, a plasma polymer layer, an IR-sensitive imaging layer, and a protective layer.

The drawings and elements thereof may not be drawn to scale.

DETAILED DESCRIPTION OF THE PREFERRED EMBODIMENTS

1. Imaging Apparatus

An imaging apparatus suitable for use in conjunction with the present printing members includes at least one laser device that emits in the region of maximum plate responsiveness, i.e., whose $\lambda_{max}$ closely approximates the wavelength region where the plate absorbs most strongly. Specifications for lasers that emit in the near-IR region are fully described in U.S. Pat. Nos. Re. 35,512 ("the '512 patent") and 5,385,092 ("the '092 patent"), the entire disclosures of which are hereby incorporated by reference. Lasers emitting in other regions of the electromagnetic spectrum are well-known to those skilled in the art.

Suitable imaging configurations are also set forth in detail in the '512 and '092 patents. Briefly, laser output can be provided directly to the plate surface via lenses or other beam-guiding components, or transmitted to the surface of a blank printing plate from a remotely sited laser using a fiber-optic cable. A controller and associated positioning hardware maintain the beam output at a precise orientation with respect to the plate surface, scan the output over the surface, and activate the laser at positions adjacent selected points or areas of the plate. The controller responds to incoming image signals corresponding to the original document or picture being copied onto the plate to produce a precise negative or positive image of that original. The image signals are stored as a bitmap data file on a computer. Such files may be generated by a raster image processor ("RIP") or other suitable means. For example, a RIP can accept input data in page-description language, which defines all of the features required to be transferred onto the printing plate, or as a combination of page-description language and one or more image data files. The bitmaps are constructed to define the hue of the color as well as screen frequencies and angles.

Other imaging systems, such as those involving light valving and similar arrangements, can also be employed; see, e.g., U.S. Pat. Nos. 4,577,932; 5,517,359; 5,802,034; and 5,861,992, the entire disclosures of which are hereby incorporated by reference. Moreover, it should also be noted that image spots may be applied in an adjacent or in an overlapping fashion.

The imaging apparatus can operate on its own, functioning solely as a platemaker, or can be incorporated directly into a lithographic printing press. In the latter case, printing may commence immediately after application of the image to a blank plate, thereby reducing press set-up time considerably. The imaging apparatus can be configured as a flatbed recorder or as a drum recorder, with the lithographic plate blank mounted to the interior or exterior cylindrical surface of the drum. Obviously, the exterior drum design is more appropriate to use in situ, on a lithographic press, in which case the print cylinder itself constitutes the drum component of the recorder or plotter.

In the drum configuration, the requisite relative motion between the laser beam and the plate is achieved by rotating the drum (and the plate mounted thereon) about its axis and moving the beam parallel to the rotation axis, thereby scanning the plate circumferentially so the image "grows" in the axial direction. Alternatively, the beam can move parallel to the drum axis and, after each pass across the plate, increment angularly so that the image on the plate "grows" circumferentially. In both cases, after a complete scan by the beam, an image corresponding (positively or negatively) to the original document or picture will have been applied to the surface of the plate.

In the flatbed configuration, the beam is drawn across either axis of the plate, and is indexed along the other axis after each pass. Of course, the requisite relative motion between the beam and the plate may be produced by movement of the plate rather than (or in addition to) movement of the beam.

Regardless of the manner in which the beam is scanned, in an array-type system for on-press applications it is generally preferable to employ a plurality of lasers and guide their outputs to a single writing array. The writing array is then indexed, after completion of each pass across or along the plate, a distance determined by the number of beams emanating from the array, and by the desired resolution (i.e., the number of image points per unit length). Off-press applications, which can be designed to accommodate very rapid scanning (e.g., through use of high-speed motors, mirrors, etc.) and thereby utilize high laser pulse rates, can frequently utilize a single laser as an imaging source.

2. Lithographic Printing Members

Figure 2:
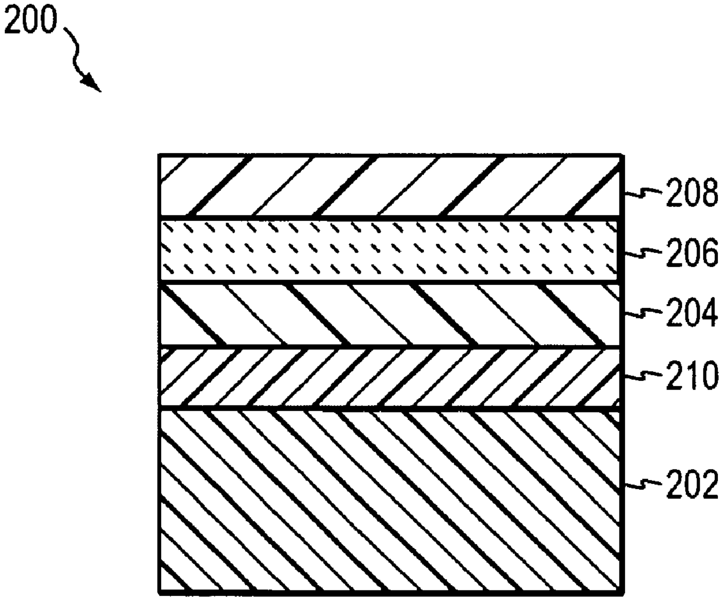
FIG. 2 is an enlarged sectional view of another embodiment of a negative-working printing member according to the invention that contains substrate, a transition layer, a plasma polymer layer, an IR-sensitive imaging layer, and a protective layer.
Figure 3:
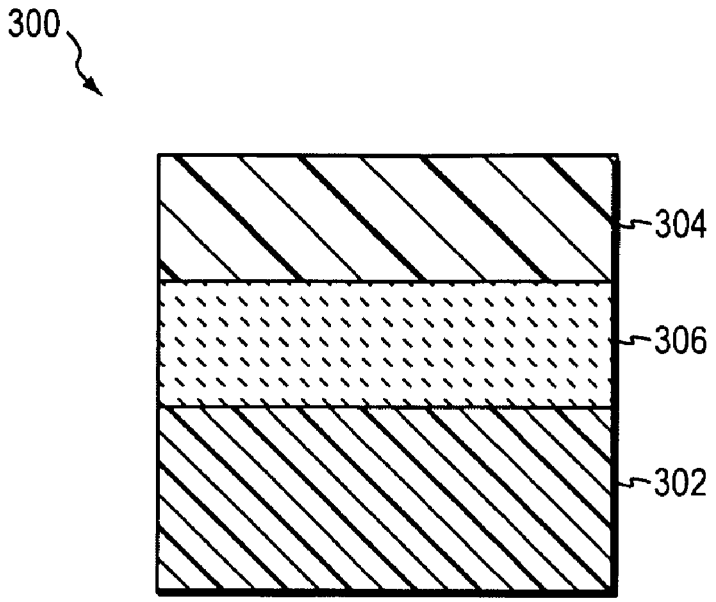
FIG. 3 is an enlarged sectional view of an embodiment of a positive-working printing member according to the invention that contains substrate, an IR-sensitive imaging layer, and a plasma polymer layer.
Figure 4:
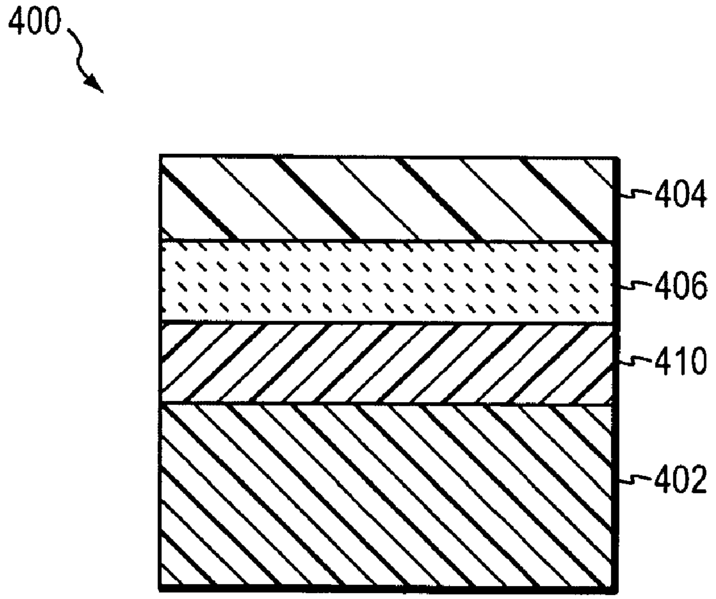
FIG. 4 is an enlarged sectional view of another embodiment of a positive-working printing member according to the invention that contains substrate, a transition layer, an IR-sensitive imaging layer, and a plasma polymer layer.

FIG. 1 illustrates an embodiment of a negative-working printing member 100 according to the invention that includes a substrate 102, a plasma polymer layer 104, an IR-sensitive imaging layer 106, and a protective layer 108. FIG. 2 illustrates another embodiment of a negative-working printing member 200 according to the invention that includes a substrate 202, a plasma polymer layer 204, an IR-sensitive imaging layer 206, a protective layer 208, and a transition layer 210 disposed between the substrate 202 and the plasma polymer layer 204. FIG. 3 illustrates an embodiment of a positive-working printing member 300 according to the invention that includes a substrate 302, an IR-sensitive imaging layer 306, and a plasma polymer layer 304. FIG. 4 illustrates another embodiment of a positive-working printing member 400 according to the invention that includes a substrate 402, an IR-sensitive imaging layer 406, a plasma polymer layer 404, and a transition layer 410 disposed between the substrate 402 and the imaging layer 406. Each of these layers and their functions will be described in detail below.

a. Substrate 102, 202, 302, 402

The substrate provides dimensionally stable mechanical support to the printing member. The substrate should be strong, stable, and flexible. One or more surfaces of the substrate can be either hydrophilic or oleophilic. Suitable substrate materials include, but are not limited to, metals, polymers, and paper.

Metals suitable for use in substrates according to the invention include, but are not limited to, aluminum, chromium, steel, and alloys thereof, which may have another metal (e.g., copper) plated over one surface. Metal substrates can have thicknesses ranging from about 50 µm to about 500 µm or more, with thicknesses in the range of about 100 µm to about 300 µm being preferred.

One or more surfaces of a metal substrate may be anodized. Anodizing increases the hardness and abrasion resistance of the metal surface, which improves the mechanical strength of the substrate. The anodic layer can also control dissipation of heat into the substrate, thus increasing the imaging efficiency of the printing member. An anodized aluminum substrate consists of an unmodified base layer and a porous, anodic aluminum oxide coating thereover. The anodized aluminum surface is hydrophilic; however, without further treatment, the oxide coating would lose wettability due to further chemical reaction. Anodized substrates are, therefore, typically exposed to a silicate solution or other suitable reagent (e.g., a phosphate reagent) that stabilizes the hydrophilic character of the plate surface. In the case of silicate treatment, the surface may assume the properties of a molecular sieve with a high affinity for molecules of a definite size and shape—including, most importantly, water molecules.

A preferred metal substrate is an anodized aluminum plate with a low degree of graining and an anodic layer having a thickness between about 0.5 µm and about 3 µm (available, for example, from Precision Lithograining Corp., South Hadley, Mass.).

Polymers suitable for use in substrates according to the invention include, but are not limited to, polyesters (e.g., polyethylene terephthalate and polyethylene naphthalate), polycarbonates, polyurethane, acrylic polymers, polyamide polymers, phenolic polymers, polysulfones, polystyrene, and cellulose acetate. A preferred polymeric substrate is polyethylene terephthalate film, such as the polyester films available from E. I. duPont de Nemours Co. (Wilmington, Del.) under the trademarks of MYLAR and MELINEX, for example.

Polymeric substrates can be coated with a transition layer to improve the mechanical strength and durability of the substrate and/or to alter the hydrophilicity or oleophilicity of the surface of the substrate. A hydrophilic transition layer may include porous materials with oxygen functional groups at the surface. The addition of hydrophilic fillers such as, for example, silica particles, also enhances the hydrophilicity of the transition layer. Examples of suitable materials for hydrophilic transition layers according to the invention include proprietary hard coat materials supplied by Bekaert Specialty Films, LLC (San Diego, Calif.). Other suitable formulations and application techniques for transition layers are described below and disclosed, for example, in U.S. Pat. No. 5,339,737, the entire disclosure of which is hereby incorporated by reference.

Polymeric substrates can have thicknesses ranging from about 50 µm to about 500 µm or more, depending on the specific printing member application. For printing members in the form of rolls, thicknesses of about 200 µm are preferred. For printing members that include transition layers, polymer substrates having thicknesses of about 50 µm to about 100 µm are preferred.

A wide variety of papers may be utilized as a substrate. Typically, papers are saturated with a polymeric treatment to improve dimensional stability, water resistance, and strength during the wet lithographic printing.

It should be understood that any of the embodiments 100–400 may be fabricated with a metal, paper, polymer or other substrate material.

b. Transition Layer 210, 410

The transition layer serves to relieve stress between a relatively soft polymer substrate and the harder layers above; it is typically used when the polymer lacks suitable mechanical properties to act as a durable substrate. The transition layer generally is a hard organic polymer coating selected on the basis of specific mechanical properties, such as hardness and Young's modulus. The transition layer also should exhibit good adherence to the substrate and overlying layers. Preferred materials include hard polymer coatings based on thermal, UV, or e-beam cured acrylate monomers and oligomers. Filler materials, such as silica and/or titanium oxide, may be included in the transition layer to improve the mechanical properties of the coatings. Examples of commercially available materials suitable for use in transition layers include MARNOT and TERRAPIN coatings sold by Tecra Corporation (New Berlin, Wis.), and hard coats supplied by Bekaert Specialty Films, LLC, (San Diego, Calif.).

The transition layer can be applied to the substrate using any suitable coating technique known in the art. For example, the transition layer polymer can be dissolved or suspended in a solvent, applied to the substrate using a wire-wound rod, and dried and cured to form a uniform transition layer. The transition layer is generally applied to a thickness of about 1 µm to about 4 µm.

c. Plasma Polymer Layer 104, 204, 304, 404

The plasma polymer layer serves as the ink-receiving layer of lithographic printing members according to the invention. Plasma polymer layers are oleophilic and hydrophobic; thus, during the print-making process, the plasma polymer layers exhibit a strong affinity for ink and a weak affinity for the water component of fountain solution. Plasma polymer layers should also exhibit good adhesion to a variety of substrate and imaging-layer materials.

The plasma polymer layer is formed by vacuum plasma polymerization of a hydrocarbon gas. In a particular embodiment, the plasma polymer is produced using planar DC or pulsed magnetron source plasma. Other plasma sources known in the art, such as glow discharge plasma, can also be utilized to form the plasma polymer layer. Suitable plasma polymerization processes are straightforwardly identified by those of skill in the art, e.g., by reference to Vossen & Kern, "Thin Film Processes II" (1991, Academic Press Inc.).

Suitable hydrocarbon gases for the plasma polymerization process include, but are not limited to, methane, ethane, propane, ethylene, acetylene, and mixtures thereof. In a particular embodiment, the hydrocarbon gas is methane. In addition, other reactive and/or non-reactive gases may be mixed with the hydrocarbon gas prior to the plasma polymerization process.

Prior to plasma deposition, the substrate is loaded into the vacuum system and the system is evacuated to a pressure on the order of about $10^{-5}$ Torr. This low pressure reduces the amount of water and other contaminants that can adversely affect the properties of the vacuum-deposited plasma polymer layer. For example, reduction or elimination of oxygen in the deposition system is important because oxygen can form active species that react with the substrate and other species in the plasma to produce an oxygen-containing plasma polymer. The presence of oxygenated species in the plasma polymer can degrade its oleophilic character, which can diminish print quality. The plasma polymer film deposition process is generally carried out at pressures on the order of 1 to 3 mTorr.

The properties of the deposited plasma polymer layer (e.g., thickness, uniformity, etc.) depend on parameters such as type of cathode used, power used to activate the plasma, deposition time, partial pressure, and gas flow. Selection of optimum deposition conditions is well within the skill of practitioners in the art. The thickness of the plasma polymer layer can range from a few monolayers of material up to about 20 nm. In particular embodiments, the plasma polymer layer is less than about 15 nm, or between about 5 nm and about 10 nm.

The properties of layers produced by plasma polymerization of simple hydrocarbons are distinct from those of polymers formed via conventional polymerization methods. In general, the plasma polymer layers deposited according to the invention are highly cross-linked, pinhole free, insoluble, and rigid. The plasma polymer layer is substantially transparent to the near-IR region typical of the laser output used in lithographic imaging devices. In addition, the plasma polymer layer does not change the absorbance and reflectivity of the material on which it is coated.

In general, the surface of the plasma polymers is nonpolar, leading to its oleophilic and hydrophobic character. X-ray photoelectron spectroscopy (XPS) studies of the near-surface chemical composition of the plasma polymer layers according to the invention confirm that the surface does not contain polar functional groups (e.g., oxygen-containing functional groups such as hydroxyls, carboxyls, etc.) that could interact with polar molecules such as water. Additional work on surface topography using scanning electron microscopy (SEM) shows that the plasma polymerization process does not cause appreciable changes in the surface topography of the surfaces to which it is applied, which indicates that the changes in surface wetting behavior are due to the oleophilic plasma polymer layer and not changes in the microstructure of the underlying layer.

d. Imaging Layer 106, 206, 306, 406

The imaging layer absorbs imaging radiation and is at least partially ablated, thus capturing the image on the printing member. The imaging layer can be hydrophilic or oleophilic. The imaging layer should be hard yet flexible, and highly wear-resistant. In addition, materials utilized in this layer should form a strong bond to surrounding layers, but the bond should be easily weakened during laser ablation. Suitable materials for the imaging layer include, but are not limited to, ceramics, metals, metal oxides, and polymers.

Ceramics include refractory oxides, carbides, and nitrides of metals and non-metals. Suitable ceramic materials include, but are not limited to, interstitial carbides (e.g., TiC, ZrC, HfC, VC, NbC, TaC, $Cr_3C$, $Mo_2C$, and WC), covalent carbides (e.g., $B_4C$ and SiC), interstitial nitrides (e.g., TiN, ZrN, HfN, VN, NbN, TaN, BN, and $Si_3N_4$), metal oxides (e.g., TiO, $Ti_2O_3$, BeO, MgO, and $ZrO_2$), carbonitrides, oxynitrides, oxycarbides, as well as combinations thereof. Other suitable ceramic materials are straightforwardly identified by those of skill in the art, e.g., by reference to Pierson, "Handbook of Refractory Carbides and Nitrides" (1996, William Andrew Publishing, NY) (incorporated herein by reference). Ceramic imaging layers may also include dopants, such as copper, for example.

Ceramic imaging layers can be deposited using any vacuum deposition technique known in the art suitable for deposition of inorganic compounds. Magnetron sputtering deposition is a preferred technique because of the well-known advantages for coating of large-area substrates. The magnetron sputtering process is typically carried out at pressures on the order of about 1 to 3 mTorr. This low pressure reduces the amount of water and other contaminants that could affect the properties of the ceramic imaging layer. For example, reduction or elimination of oxygen in the deposition system is important because oxygen can react with the metal species during the magnetron deposition process, leading to the deposition of non-stoichiometric ceramic films with degraded optical, thermal, and mechanical properties. Selection of optimum deposition conditions for films with selected atomic composition is well within the skill of practitioners in the art. Ceramic imaging layers are generally applied in thicknesses ranging from about 20 nm to about 45 nm.

The sputtering deposition process is desirably carried out in sequence in the same vacuum system after deposition of the plasma polymer layer. Therefore, the base pressure of the system is kept at values on the order of $10^{-5}$ Torr. This low pressure reduces the amount of water and other contaminants that could affect the properties of the ceramic imaging layer. For example, reduction or elimination of oxygen in the deposition system is important because oxygen can react with the metal species during magnetron deposition process, leading to the deposition of non-stoichiometric ceramic films with degraded optical, thermal, and mechanical properties. The magnetron sputtering deposition process is typically carried out using flows of methane and argon mixtures that bring the total pressures to values on the order of 1–3 mTorr.

Suitable metals for the imaging layer include, but are not limited to, titanium, aluminum, zinc, chromium, vanadium, zirconium, and alloys thereof. Metal imaging layers are preferably thin (e.g., about 50 Å to about 500 Å) to minimize heat transport within the imaging layer (i.e., transverse to the direction of the imaging pulse), thereby concentrating heat within the region of the imaging pulse so as to effect image transfer at minimal imaging power. While metals have the optical and thermal properties required for the imaging mechanism described herein, they may lack the mechanical and tribological characteristics required for structures that capable of enduring the wear conditions imposed by a printing press. Accordingly, if metals are to be used, they are desirably combined with a durable or hard ceramic material or layer.

Polymers suitable for use in imaging layers according to the invention may inherently IR-absorbing (e.g., polypyrroles) or may contain one or more IR-absorbing additives dispersed therein. Suitable polymers include, but are not limited to, vinyl-type polymers (e.g., polyvinyl alcohol) polyurethanes, cellulosic polymers (e.g., nitrocellulose), polycyanoacrylates, and epoxy polymers. The imaging layers may also be formed from a combination of one or more polymers, such as nitrocellulose in combination with a vinyl-type polymer.

Suitable IR-absorbing materials include a wide range of dyes and pigments, such as carbon black (e.g., CAB-O-JET 200, sold by Cabot Corporation, Bedford, Mass., and BONJET BLACK CW-1, sold by Orient Corporation, Springfield, N.J.), nigrosine-based dyes, phthalocyanines (e.g., aluminum phthalocyanine chloride, titanium oxide phthalocyanine, vanadium (IV) oxide phthalocyanine, and the soluble phthalocyanines supplied by Aldrich Chemical Co., Milwaukee, Wis.), naphthalocyanines, iron chelates, nickel chelates, oxoindolizines, iminium salts, and indophenols, for example. Any of these materials may be dispersed in a prepolymer before cross-linking into a final film. Alternatively, the absorber may be a chromophore chemically integral with the polymer backbone; see, e.g., U.S. Pat. No. 5,310,869. Polymeric imaging layers can include other additives known in the art, including, for example, cross-linking agents.

Polymeric imaging layers can be applied using any coating technique known in the art such as wire-wound rod coating, reverse roll coating, gravure coating, or slot die coating, for example.

e. Protective Layer 108, 208

Negative-working printing members include a hydrophilic protective layer disposed over the imaging layer to protect the surface of the imaging layer against contamination due to exposure to air and damage during plate handling. In addition, the protective layer may help to control the imaging process by modifying the heat dissipation characteristics of the printing member at the air-imaging layer interface. The protective layer may be totally or partially removed in the first stages of the printing process with the aqueous solutions used in press systems. Portions of the protective layer that remain bonded to the imaging layer enhance the interaction of water component of the fountain solution with the non-image surfaces of the lithographic printing member.

Suitable materials for protective layers according to the invention include hydrophilic polymers, such as polyalkyl ethers, polyhydroxyl compounds, and polycarboxylic acids. For example, a hydrophilic protective layer may include a fully hydrolyzed polyvinyl alcohol (e.g., Celvol 305, 325 and 425 sold by Celanese Chemicals, Ltd. Dallas, Tex.), which are usually manufactured by hydrolysis of polyvinyl acetates. The use of fully hydrolyzed alcohol is preferred to assure that residual non-hydrolyzed acetate does not affect the hydrophilic behavior of the surface. The presence of residual polyvinyl acetate moieties in the protective layer promotes interaction of the non-image areas of the printing member with printing inks, which can diminish print quality.

Protective layers are typically applied between 0.05 and 1 $g/m^2$ using coating techniques known in the art, such as wire-wound rod coating, reverse roll coating, gravure coating, or slot die coating. For example, in particular embodiments, the protective layer is applied using a wire-round rod, followed by drying in a convection oven.

The protective layer can also include hydrophilic plasma polymer films deposited by vacuum coating techniques, as discussed above. Such protective layers may also be applied by plasma polymerization of gas mixtures that produce polymer films with polar functional groups. For example, a protective layer may applied using plasmas of reactive gas mixtures (e.g., oxygen, carbon dioxide, nitrogen, and/or nitrogen oxide mixed with hydrocarbon gases), or using hydrocarbons containing oxygen functional groups.

3. Imaging Techniques

Figure 5A:
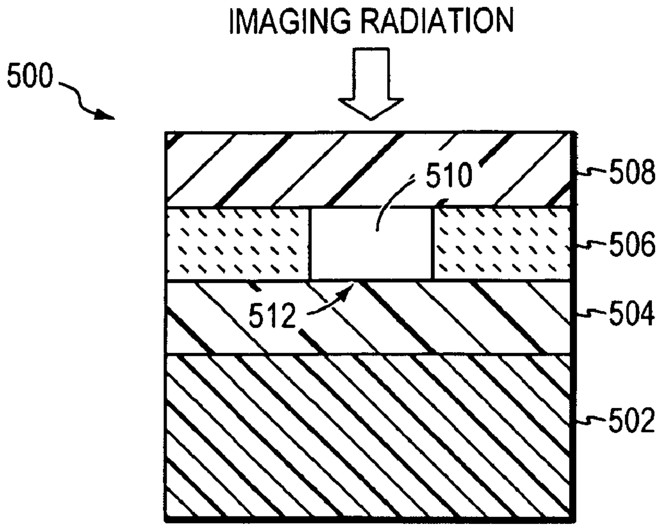
FIGS. 5A–5C are enlarged sectional views of a negative-working printing member illustrating an imaging mechanism according to the invention.
Figure 5B:
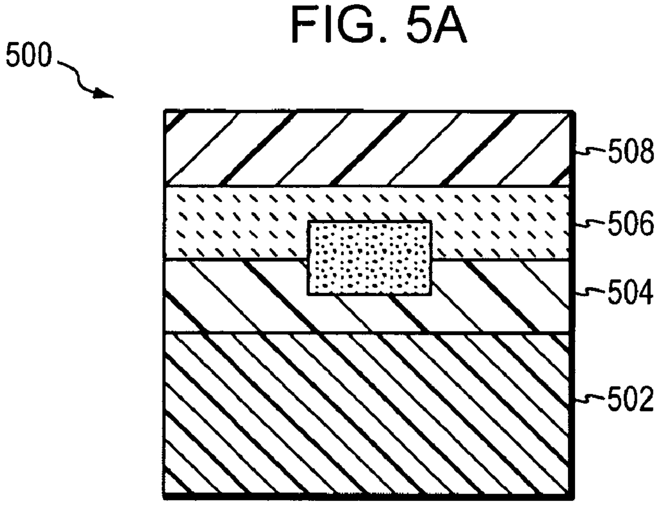
Figure 5C:
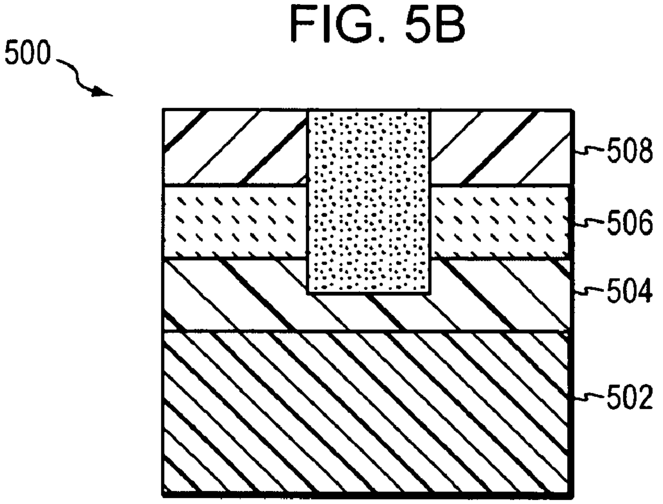

FIGS. 5A–5C illustrate the consequences of imaging an embodiment of a negative-working printing member 500 according to the invention, which includes a substrate 502, an oleophilic plasma polymer layer 504, a hydrophilic imaging layer 506, and a hydrophilic protective layer 508. As illustrated in FIG. 5A, the exposed area 510 of the imaging layer 506 absorbs the imaging pulse and converts it to heat. The heat diffuses through the imaging layer 506 until it reaches the interface 512 between the imaging layer 506 and the plasma polymer layer 504. The plasma polymer layer 504, the substrate 502, and the protective layer 508 generally do not conduct heat as well as the imaging layer 506, so the heat from the imaging layer 506 builds up at the interface 512 until the imaging layer 506 and portions of the plasma polymer layer 504 near the interface 512 ablate, as illustrated in FIG. 5B. Ablation occurs, for example, when the interfacial polymer layers undergo either rapid phase transformation (e.g., vaporization) or rapid thermal expansion. This process is mainly attributed to the contribution of an explosive mechanism generated in the image areas of the plate by exposure to laser radiation. In this context, the plasma polymer layer 504 enhances production of vaporized materials at the interface during laser exposure, leading to the development of a positive pressure that assists film separation or ablation. Differences in thermal expansion coefficients of the plasma polymer layer 504 and the imaging layer 506 may also disrupt the adhesion of the layers at the interface 512. The separation of the imaging layer 506 from the plasma polymer layer 504 (i.e., the "image-release" mechanism) reduces the amount of energy necessary to image printing members according to the invention, thus increasing the efficiency of printing processes utilizing such printing members.

After imaging, the protective layer 508, the imaging layer 506, and at least a portion of the plasma polymer layer 504 are degraded and/or de-anchored in the areas that received imaging radiation, as shown in FIG. 5C. The exposed areas that contain the ablation debris are ink-receptive and serve as the precursor to the image areas of the printing member, while the non-imaged portions of the hydrophilic protective layer 508 accept water. Thus, the printing member can be used on press immediately after being imaged without the need for a post-imaging processing step.

After repeated exposure to printing fluids, the ablation debris may be carried away from the printing member 500; at this point, the underlying remnants of the plasma polymer layer 504 provide the necessary ink-accepting surface. In addition, all or a portion of the protective layer 508 may be removed by the printing fluids, exposing the underlying hydrophilic imaging layer 506 which acts as the water-accepting surface.

It should be understood that the imaging mechanism described above also applies to embodiments of negative-working printing members that include a transition layer disposed between the substrate and the plasma polymer layer (e.g., the embodiment illustrated in FIG. 2).

In embodiments where the substrate (or transition layer) is oleophilic, all or a part of the plasma polymer layer may be ablated during the imaging process. In embodiments that include a hydrophilic substrate (or transition layer), at least a portion of the plasma polymer layer should remain after imaging.

Figure 6A:
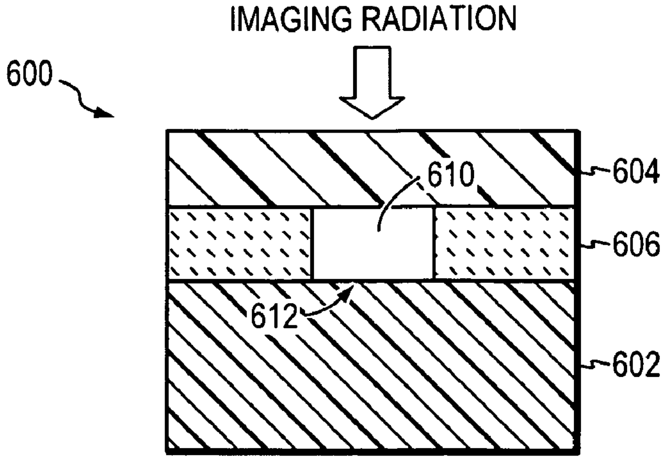
FIGS. 6A–6B are enlarged sectional views of a positive-working printing member illustrating an imaging mechanism according to the invention.
Figure 6B:
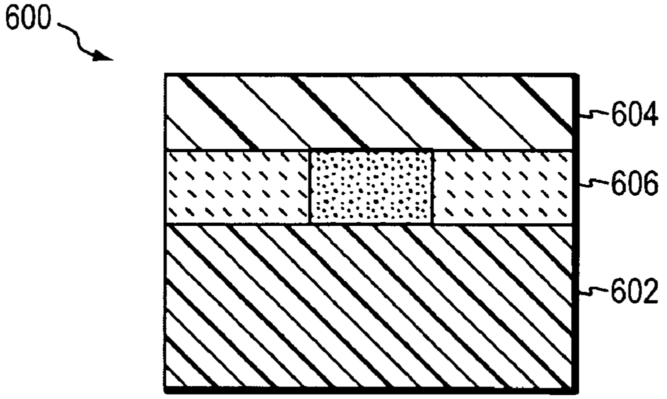
Figure 6C:
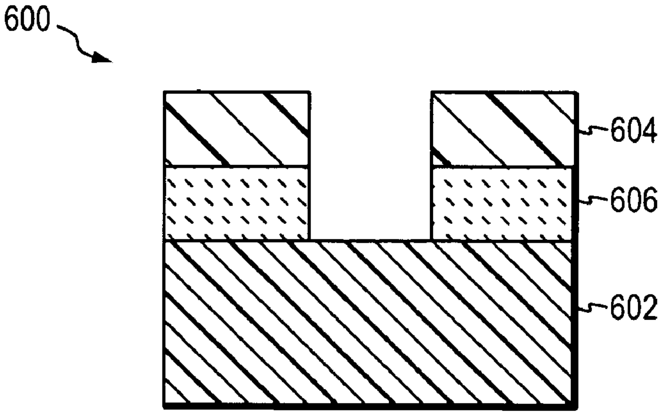

FIGS. 6A–6C illustrate the consequences of imaging an embodiment of a positive-working printing member 600 according to the invention, which includes a hydrophilic substrate 602, an imaging layer 606, and an oleophilic plasma polymer layer 604. As illustrated in FIG. 6A, the exposed area 610 of the imaging layer 606 absorbs the imaging pulse and converts it to heat. At least a portion of the imaging layer 606 in the areas that received imaging radiation ablates, as illustrated in FIG. 6B. The imaging layer debris, along with the portions of the plasma polymer layer 604 that overlay the imaged areas, are removed on-press by the fountain solution (e.g., during the prewetting cycle), exposing the hydrophilic substrate 602, as illustrated in FIG. 6C. The exposed substrate 602 acts as the water-receptive portion of the printing member, while the remaining portions of the plasma polymer layer 604 are ink-accepting.

It should be understood that the imaging mechanism described above also applies to embodiments of positive-working printing members that include a transition layer disposed between the substrate and the imaging layer (e.g., the embodiment illustrated in FIG. 4).

Figure 7A:
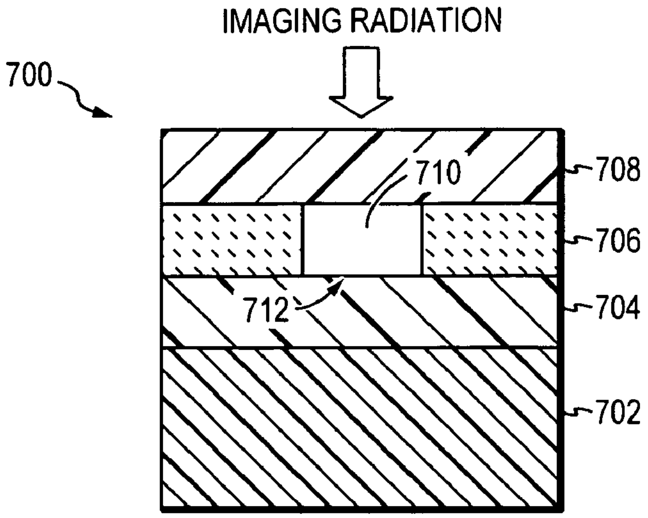
FIGS. 7A–7B are enlarged sectional views of a positive-working printing member illustrating another imaging mechanism according to the invention.
Figure 7B:
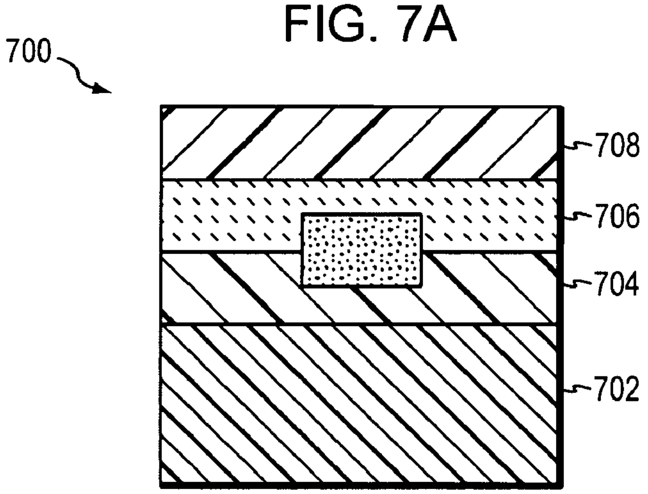
Figure 7C:
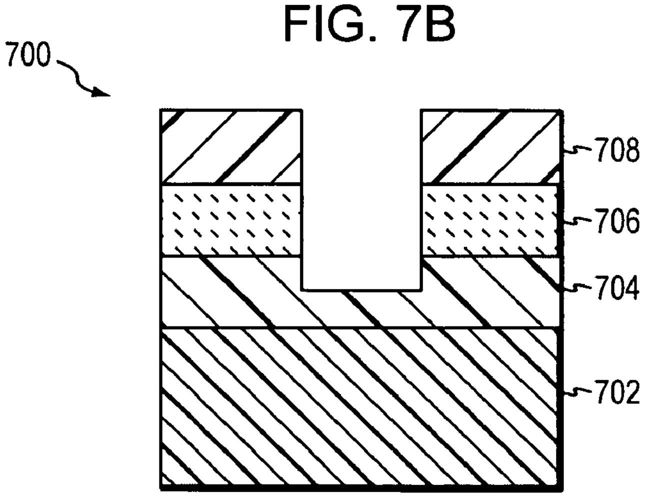

FIGS. 7A–7C illustrate the consequences of imaging another embodiment of a positive-working printing member 700 according to the invention, which includes a hydrophilic substrate 702, a hydrophilic plasma polymer layer 704, an imaging layer 706, and an oleophilic plasma polymer layer 708. As illustrated in FIG. 7A, the exposed area 710 of the imaging layer 706 absorbs the imaging pulse and converts it to heat. The heat diffuses through the imaging layer 706 until it reaches the interface 712 between the imaging layer 706 and the hydrophilic plasma polymer layer 704. As discussed above, the imaging layer 706 is the most efficient heat conductor, so heat from the imaging layer 706 builds up at the interface 712 until the imaging layer 706 and portions of the hydrophilic plasma polymer layer 704 near the interface 712 ablate, as illustrated in FIG. 7B. Ablation causes a positive pressure buildup that aids in separating the layers. Differences in thermal expansion coefficients of the hydrophilic plasma polymer layer 704 and the imaging layer 706 may also disrupt the adhesion of the layers at the interface 712. As discussed above, these image-release mechanisms reduce the amount of energy necessary to image printing members according to the invention, thus increasing the efficiency of printing processes utilizing such printing members.

After imaging, the imaging layer 706, and at least a portion of the hydrophilic plasma polymer layer 704 are degraded in the areas that received imaging radiation. The debris in the imaged areas of the printing member, along with the portions of the oleophilic plasma polymer layer 708 that overlay the imaged areas, are removed on-press by the fountain solution (e.g., during the prewetting cycle), exposing the remnants of the hydrophilic plasma polymer layer 704 (as illustrated in FIG. 7C), or the hydrophilic substrate 702. The remnants of the hydrophilic plasma polymer layer 704 and/or the exposed substrate 702 act as the water-receptive portion of the printing member, while the remaining portions of the oleophilic plasma polymer layer 708 are ink-accepting.

It should be understood that the imaging mechanism described above also applies to embodiments of positive-working printing members that include a transition layer disposed between the substrate and the hydrophilic plasma polymer layer.

4. EXAMPLES

Several embodiments of the present invention are described in the following examples, which are meant to illustrate, not to limit, the scope and nature of the present invention.

Plasma polymerization was conducted on different substrates that are suitable for the construction of the different printing member embodiments of the present invention. In all cases, the plasma polymerization process was carried out with methane plasmas produced by a DC magnetron sputtering source to yield plasma polymer layers with thickness in the range of about 1 nm to about 20 nm.

A variety of experimental techniques were used to study the properties of plasma polymer layers and their effect on the surface properties of different substrates. The composition of the plasma atmosphere during deposition was monitored using mass spectrometry. Surface information was inferred from surface sensitive techniques such as X-ray photoelectron spectroscopy XPS (also known as Electron Spectroscopy for Chemical Analysis, ESCA) and contact angle measurements. Possible changes in surface topography due to plasma polymer layers deposition on different substrates were investigated with scanning electron microscopy (SEM). The optical reflectance and absorbance of the plasma polymer layers and printing member structures were determined with UV-Visible-Near-IR reflectance spectroscopy.

Changes in the composition of the gases present in the vacuum chamber during the plasma polymerization process were monitored using mass spectrometry. For example, the production of hydrogen and larger molecules (e.g., carbon species with two to four carbon atoms) during methane plasma production was confirmed using mass spectrometry, indicating that the activated methane molecules grow and recombine to form polymeric species in the plasma and the rest of the vacuum system.

Example 1

A plasma polymer layer was applied to the surface of a white clear polyester base (MELINEX from E. I. duPont de Nemours Co., Wilmington, Del.) coated with a transparent hydrophilic polymer coating (Bekaert Specialty Films, San Diego, Calif.) using methane plasma produced by a DC magnetron sputtering source. A detailed XPS study of the coated and uncoated substrates showed that the polymerization process produced a plasma polymer layer with an extremely low percentage of oxygen species.

To determine the effect that the plasma polymer layer had on surface wettability of the hydrophilic polymer substrate, contact angle studies for polar (i.e., water) and non-polar (i.e., methylene iodide) fluids were conducted on the uncoated and coated substrates. The results of the studies are summarized in Table 1. Approximate values of the surface energy components $\gamma^{Polar}$, $\gamma^{Disperse}$, and $\gamma^{Total}$ were calculated using Wu's model harmonic mean approach. See, e.g., Wu, "Polymer Interface and Adhesion" (1982, Marcel Dekker).

TABLE 1

| Sample | Water contact angle (degree) | $CH_2I_2$ contact angle (degree) | $\gamma^{Polar}$ (dyne/cm) | $\gamma^{Disperse}$ (dyne/cm) | $\gamma^{Total}$ (dyne/cm) |
|---|---|---|---|---|---|
| Hydrophilic polymer | 14 ± 1 | 29 ± 2 | 32.0 | 44.6 | 76.6 |
| Hydrophilic polymer coated with plasma polymer | 96 ± 2 | 13 ± 1 | 1.1 | 49.5 | 50.6 |

As Table 1 indicates, the substrate coated with the plasma polymer layer was more oleophilic and hydrophobic than the untreated polyester substrate. The large differences in oleophilcity and hydrophilicity suggest the utility of polyester substrates coated with a methane-based plasma polymer layers in lithographic printing members. As Table 1 indicates, the hydrophilic surface becomes markedly hydrophobic after deposition of the plasma polymer layer. The plasma polymer layer displays relatively high surface energy with very low polar contribution. The large oleophilicity and low hydrophilicity of the plasma polymer layer support the utility of this layer as the ink-receptive member of a lithographic printing plate.

The durability of the plasma polymers layer was evaluated using different solvent resistance tests under varying abrasive conditions. Tests included abrasion with solvents such as isopropanol and water, and immersion in the same solvents for long periods of time. The integrity of the plasma polymer layer was evaluated by monitoring changes in surface composition and other surface properties using contact angle and XPS analysis of the abraded or treated surfaces. In general, the surface properties of the plasma polymer layer were not affected by exposure to a wide variety of conditions that simulate the typical solvents and abrasion conditions used in press operations.

These tests illustrate that polyester substrates coated with a plasma polymer layer exhibit pronounced hydrophobic behavior and also show strong interaction with non-polar molecules. The plasma polymer layers also exhibit good durability and resistance to abrasion. The surface properties of the plasma polymer layers do not change upon exposure to typical print-making conditions for long periods of time.

Example 2

Plasma polymerization was carried out on an anodized aluminum substrate having an anodic layer of 0.75 μm (Precision Lithograining Corp., South Hadley, Mass.) in the same manner as in Example 1. The surface properties were also evaluated in the same manner as in Example 1. The results of the experiments are summarized in Table 2.

TABLE 2

| Sample | Water contact angle (degree) | $CH_2I_2$ contact angle (degree) |
|---|---|---|
| Anodized aluminum | Spread | 43 ± 1 |
| Anodized aluminum coated with plasma polymer | 100 ± 2 | 17 ± 1 |

As Table 2 illustrates, the plasma polymer layer effectively converted the hydrophilic anodic aluminum surface to an oleophilic surface.

Example 3

A white clear polyester base (MELINEX from E. I. duPont de Nemours Co., Wilmington, Del.) with a transparent hydrophilic polymer coating (Bekaert Specialty Films, San Diego, Calif.) was coated with a 30 nm layer of titanium carbide (TiC) deposited by reactive magnetron sputtering deposition of titanium in an argon/methane atmosphere. The TiC layer was subsequently coated with a methane-based plasma polymer layer about 5 nm thick. XPS measurements confirmed that the plasma process produced a stable plasma polymer layer on the surface of the TiC layer.

The effect of air exposure on the uncoated and coated ceramic layers was studied by measuring the contact angle for water on each plate after exposure to ambient air for different periods of time. The results of the experiments are summarized in Table 3.

TABLE 3

| | Days elapsed | | | | |
|---|---|---|---|---|---|
| | 0 | 1 | 2 | 4 | 6 |
| Water contact angle: Uncoated ceramic | Spread | 38 | 53 | 64 | 67 |
| Water contact angle: Ceramic coated with plasma polymer | 101 | 100 | 98 | 99 | 98 |

The increasing contact angle of the ceramic layer over time is attributed to the slow formation of a contamination layer formed upon exposure to air, which is described, for example, in Barr, "Modern ESCA The Principles and Practice of X-ray Photoelectron Spectroscopy" (1993, CRC Press). In contrast, the surface properties of the plate coated with the plasma polymer layer did not change appreciably with prolonged exposure to air. This experiment illustrates that plasma polymer layers can prolong the useful life of printing members that incorporate such layers.

Example 4

Negative-working printing members were produced having the general structure depicted in FIG. 2. A white clear polyester substrate (MELINEX from E. I. duPont de Nemours Co., Wilmington, Del.) was coated with a transparent hydrophilic polymer coating (Bekaert Specialty Films, San Diego, Calif.). The plates were coated with a methane-based plasma polymer layer about 4 nm thick using a magnetron sputtering system. The plasma polymer layer was subsequently coated with a TiC layer of about 30 nm, which was briefly exposed to air to allow the formation of a native oxide passivation layer. Finally, a protective layer was added to the ceramic layer by applying a 1% solution of a fully hydrolyzed polyvinyl alcohol (Celvol 325 from Celanese Chemicals, Dallas, Tex.), followed by oven drying. Control plates that did not contain plasma polymer layers were produced using similar procedures.

The minimum energy requirement for producing an acceptable image on each plate was determined using different image setters, including Presstek Pearl (Presstek, Inc., Hudson, N.H.), Dimension400 (Presstek, Inc., Hudson, N.H.) and Creo Trendsetter (Creo, Inc., Vancouver, Canada). All the imaging devices used near-IR laser diode outputs and dwell times in the microsecond range. Acceptable imaging performance refers to the production of well-differentiated image areas using power densities within the levels recommended by the commercial imaging devices, and without causing side effects to the substrate, such as thermal degradation.

The imaging performance of the plates including plasma polymer layers exceeded that of the control plate. For example, the energy required to image the control plate using the Creo Trendsetter image setter exceeded 420 $mJ/cm^2$. This high energy level, however, also caused some thermal degradation of the underlying substrate, resulting in a reduction in the ink-receptivity of the exposed image areas. In contrast, the plates containing plasma polymer layers required imaging energy below 370 $mJ/cm^2$. At these levels, it was possible to produce acceptable imaging performance without affecting the ink receptivity of the imaged areas. In addition, the ink-receptivity remained stable in long run-length press works, and the plate durability on-press was not affected by the incorporation of the plasma polymer layer in the plate construction.

Example 5

Three negative-working printing members having plasma polymer layers of varying thickness were produced in the manner described in Example 4. For comparison, a control plate, which did not contain a plasma polymer layer, was also constructed. The minimum energy requirements for imaging each plate was determined using a Creo Trendsetter image setter (Creo, Inc., Vancouver, Canada). The results of these experiments are summarized in Table 4 below.

The durability of each plate was evaluated using a standard pencil hardness test, in which standard pencils of various hardnesses (with 9H being the hardest) are drawn across the plate surface. The hardest pencil that does not leave a mark on the surface is considered the "pencil hardness" of the plate. In addition, the tribology characteristics of each plate were evaluated by exposing the plates to a reciprocating abrasive process using a soft abrader material and isopropyl alcohol for lubrication. The results of these experiments are summarized in Table 4 below.

TABLE 4

| Plasma polymer layer thickness (nm) | Imaging energy ($mJ/cm^2$) | Pencil hardness | Wear test (No. of cycles) |
|---|---|---|---|
| 0 | >420 | 6H | 380 |
| 3 ± 1 | 380 | 6H | 380 |
| 6 ± 1 | 350 | 6H | 350 |
| 12 ± 1 | 320 | 4H–5H | 240 |

As Table 4 indicates, the energy required to image the printing members decreased as the thickness of the plasma polymer layer increased. However, the 12 nm plasma polymer plate displayed degraded interfacial adhesion and wear performance. Based on these experiments, plate structures that have plasma polymer layers in the range of about 4 nm to about 10 nm display the best compromise between durability and imaging performance.

Example 6

Negative-working printing members having TiC imaging layers of varying thickness were produced and imaged in the manner described in Example 4. It was determined that a TiC layer having a minimum thickness on the order of 30 nm was required to obtain acceptable imaging performance, as described above. Slight improvements in imaging performance of the plate constructions were obtained for TiC imaging layer thickness between 30 nm to 45 nm. For example, using a Creo Trendsetter image setter (Creo, Inc., Vancouver, Canada), the power level requirement was reduced from 390 $mJ/cm^2$ to about 320 $mJ/cm^2$ upon increasing the TiC layer thickness from 30 nm to 45 nm.

The thickness of the TiC imaging layer also affected plate durability, defined as the scratch and wear resistance of a printing member. Plate structures with TiC layers less than 35 nm exhibited reduced scratch and wear resistance, while there were less significant changes in plate durability for plate constructions with TiC layers of thickness in the range of 35 to 45 nm.

Example 7

Negative-working printing members having anodized aluminum substrates were produced having the general structure depicted in FIG. 1. Anodized aluminum substrates with 1500 nm thick anodic aluminum oxide layers (Precision Lithograining Corp., South Hadley, Mass.) were coated with methane-based plasma polymer layers to a thickness of about 5 nm using a magnetron sputtering system. The plasma polymer layers were subsequently coated with TiC imaging layers (about 35 nm thick), which were briefly exposed to air to allow the formation of a native oxide passivation layers. Finally, protective layers were added to the ceramic layers by applying a 1% solution of a fully hydrolyzed polyvinyl alcohol (Celvol 325 from Celanese Chemicals, Dallas, Tex.), followed by oven drying. Control plates that did not contain plasma polymer layers were produced using similar procedures.

The test plates were imaged on the commercial imaging devices described in Example 4 using power densities of about 390 $mJ/cm^2$, and the imaged plates were used on-press without any previous cleaning. The plates showed a quick start-up times with clean backgrounds, and the image areas displayed good ink-receptivity. In contrast, the areas of the control plate exposed to the imaging radiation were hardly affected, even at the highest power settings allowed by the imaging devices. The TiC layer was not removed in the process, and surface energy differentiation was not produced.

The results of these experiments indicate that plasma polymer layers produced according to the invention reduce the energy required to image lithographic printing members having ceramic imaging layers disposed over anodized aluminum substrates.

Example 8

Positive-working lithographic plates were produced having the general structure depicted in FIG. 4. A white clear polyester substrate (MELINEX from E. I. duPont de Nemours Co., Wilmington, Del.) was coated with a transparent hydrophilic polymer coating (Bekaert Specialty Films, San Diego, Calif.). The plates were coated with a layer of titanium carbide deposited by magnetron sputtering deposition. The carbide layer was further coated with a methane-based plasma polymer layer about 5 nm thick. The plate did not require a protective layer because of the high stability of the plasma polymer layer.

The printing members were imaged on the imaging devices described in Example 4. The imaging process exposed the underlying hydrophilic substrate without causing damage that could affect is hydrophilicity. The plates required higher energy than the equivalent negative-working versions of the plate, but the imaging efficiency was within acceptable ranges. The plates were used on press without pre-cleaning or any other treatment. The image area of the plate (i.e., the remaining portions of plasma polymer layer) displayed ink receptivity that exceeded that of commercially available printing members, while the non-image areas of the plates remained free of ink. In addition, the oleophilicity imparted by the plasma polymer layer did not change or deteriorate with the lapse of time.

Example 9

Positive-working printing members having TiC imaging layers of varying thickness were produced and imaged in the manner described in Example 8. It was determined that a TiC layer having a minimum thickness on the order of 35 nm was required to obtain acceptable imaging performance, which was slightly higher than the corresponding negative-working plates. Slight improvements in imaging performance of the plate constructions were obtained for TiC imaging layer thickness between 35 nm to 50 nm.

It will be seen that the foregoing techniques provide a basis for improved lithographic printing and superior plate constructions. The terms and expressions employed herein are used as terms of description and not of limitation, and there is no intention in the use of such terms and expressions of excluding any equivalents of the features shown and described or portions thereof. Instead, it is recognized that various modifications are possible within the scope of the invention claimed.

What is claimed is:

1. A method of imaging a lithographic printing member, the method comprising the steps of:

(a) providing a printing member having an imaging layer, a plasma polymer layer, and a substrate beneath the imaging and plasma polymer layers, wherein (i) the imaging layer absorbs imaging radiation, (ii) the plasma polymer layer comprises a plasma-polymerized hydrocarbon, and (iii) the imaging layer and at least one of the plasma polymer layer and the substrate have opposite affinities for at least one of ink and a liquid to which ink will not adhere;

(b) exposing the printing member to imaging radiation in an imagewise pattern so as to ablate at least a portion of the imaging layer exposed to the imaging radiation; and (c) removing at least the imaging layer where the lithographic printing member received radiation, thereby creating an imagewise lithographic pattern on the printing member.

2. The method of claim 1, wherein the imaging layer is hydrophilic.

3. The method of claim 1, wherein the imaging layer comprises a ceramic.

4. The method of claim 3, wherein the ceramic is selected from the group consisting of metal carbides, metal nitrides, metal oxides, carbonitrides, oxynitrides, oxycarbides, and combinations thereof.

5. The method of claim 4, wherein the ceramic is selected from the group consisting of TiC, ZrC, HfC, VC, NbC, TaC, $B_4C$, SiC, TiN, ZrN, HfN, VN, NbN, TaN, BN, $Si_3N_4$, $Cr_3C$, $Mo_2C$, WC, TiO, $Ti_2O_3$, TiO2, BeO, MgO, $ZrO_2$, and combinations thereof.

6. The method of claim 1, wherein the plasma polymer layer is oleophilic.

7. The method of claim 1, wherein the plasma polymer layer has a thickness of about 1 nm to about 20 nm.

8. The method of claim 1, wherein the hydrocarbon is selected from the group consisting of methane, ethane, propane, ethylene, and acetylene.

9. The method of claim 8, wherein the hydrocarbon comprises methane.

10. The method of claim 1, wherein the substrate is hydrophilic.

11. The method of claim 1, wherein the substrate is oleophilic.

12. The method of claim 1, wherein the substrate comprises a polymer.

13. The method of claim 12, wherein the polymer is selected from the group consisting of polyesters, polyethylene terephthalate, polyethylene naphthalate, polycarbonates, polyurethane, acrylic polymers, polyamide polymers, phenolic polymers, polysulfones, polystyrene, and cellulose acetate.

14. The method of claim 13, wherein the polymer comprises polyethylene terephthalate.

15. The method of claim 1, wherein the substrate comprises a metal.

16. The method of claim 15, wherein the metal is selected from the group consisting of aluminum, chromium, steel, and alloys thereof.

17. The method of claim 15, wherein at least one surface of the metal is anodized.

18. The method of claim 1, further comprising a transition layer disposed over the substrate.

19. The method of claim 18, wherein the transition layer comprises a polymer.

20. The method of claim 19, wherein the polymer comprises an acrylate polymer.

21. The method of claim 1, wherein the imaging layer is disposed over the plasma polymer layer.

22. The method of claim 21, further comprising a protective layer disposed over the imaging layer.

23. The method of claim 22, wherein the protective layer is hydrophilic.

24. The method of claim 22, wherein the protective layer comprises polyvinyl alcohol.

25. The method of claim 22, wherein the protective layer comprises a hydrophilic plasma polymer.

26. The method of claim 1, wherein the plasma polymer layer is disposed over the imaging layer.

27. A lithographic printing member comprising:

(a) an imaging layer that absorbs imaging radiation;

(b) a plasma polymer layer comprising a plasma-polymerized hydrocarbon; and (c) a substrate beneath the imaging and plasma polymer layers, wherein the imaging layer and at least one of the plasma polymer layer and the substrate have opposite affinities for at least one of ink and a liquid to which ink will not adhere.

28. The lithographic printing member of claim 27, wherein the imaging layer is hydrophilic.

29. The lithographic printing member of claim 27, wherein the imaging layer comprises a ceramic.

30. The lithographic printing member of claim 29, wherein the ceramic is selected from the group consisting of metal carbides, metal nitrides, metal oxides, carbonitrides, oxynitrides, oxycarbides, and combinations thereof.

31. The lithographic printing member of claim 30, wherein the ceramic is selected from the group consisting of TiC, ZrC, HfC, VC, NbC, TaC, $B_4C$, SiC, TiN, ZrN, HfN, VN, NbN, TaN, BN, $Si_3N_4$, $Cr_3C$, $Mo_2C$, WC, TiO, $Ti_2O_3$, TiO2, BeO, MgO, $ZrO_2$, and combinations thereof.

32. The lithographic printing member of claim 27, wherein the plasma polymer layer is oleophilic.

33. The lithographic printing member of claim 27, wherein the plasma polymer layer has a thickness of about 1 nm to about 20 nm.

34. The lithographic printing member of claim 27, wherein the hydrocarbon is selected from the group consisting of methane, ethane, propane, ethylene, and acetylene.

35. The lithographic printing member of claim 34, wherein the hydrocarbon comprises methane.

36. The lithographic printing member of claim 27, wherein the substrate is hydrophilic.

37. The lithographic printing member of claim 27, wherein the substrate is oleophilic.

38. The lithographic printing member of claim 27, wherein the substrate comprises a polymer.

39. The lithographic printing member of claim 38, wherein the polymer is selected from the group consisting of polyesters, polyethylene terephthalate, polyethylene naphthalate, polycarbonates, polyurethane, acrylic polymers, polyamide polymers, phenolic polymers, polysulfones, polystyrene, and cellulose acetate.

40. The lithographic printing member of claim 39, wherein the polymer comprises polyethylene terephthalate.

41. The lithographic printing member of claim 27, wherein the substrate comprises a metal.

42. The lithographic printing member of claim 41, wherein the metal is selected from the group consisting of aluminum, chromium, steel, and alloys thereof.

43. The lithographic printing member of claim 42, wherein at least one surface of the metal is anodized.

44. The lithographic printing member of claim 27, further comprising a transition layer disposed over the substrate.

45. The lithographic printing member of claim 44, wherein the transition layer comprises a polymer.

46. The lithographic printing member of claim 45, wherein the polymer comprises an acrylate polymer.

47. The lithographic printing member of claim 27, wherein the imaging layer is disposed over the plasma polymer layer.

48. The lithographic printing member of claim 47, further comprising a protective layer disposed over the imaging layer.

49. The lithographic printing member of claim 48, wherein the protective layer is hydrophilic.

50. The lithographic printing member of claim 48, wherein the protective layer comprises polyvinyl alcohol.

51. The lithographic printing member of claim 48, wherein the protective layer comprises a hydrophilic plasma polymer.

52. The lithographic imaging member of claim 27, wherein the plasma polymer layer is disposed over the imaging layer.

53. A lithographic imaging member comprising:

(a) a hydrophilic imaging layer that absorbs imaging radiation;

(b) an olephilic plasma polymer layer comprising a plasma-polymerized hydrocarbon; and (c) a substrate beneath the imaging and plasma polymer layers.

54. The lithographic imaging member of claim 53, wherein the substrate is hydrophilic.

55. The lithographic imaging member of claim 53, wherein the substrate is oleophilic.

56. The lithographic imaging member of claim 53, wherein the imaging layer is disposed over the plasma polymer layer.

57. The lithographic imaging member of claim 56, further comprising a protective layer disposed over the imaging layer.

58. The lithographic imaging member of claim 57, wherein the protective layer is hydrophilic.

59. The lithographic imaging member of claim 53, wherein the plasma polymer layer is disposed over the imaging layer.

* * * * *